United States Patent
Zhai et al.

(10) Patent No.: US 9,689,941 B2
(45) Date of Patent: Jun. 27, 2017

(54) PASSIVE $B_1$ FIELD SHIMMING (75) Inventors: Zhiyong Zhai, Solon, OH (US); Michael Andrew Morich, Mentor, OH (US); Paul Royston Harvey, Best (NL); Miha Fuderer, Eindhoven (NL)

(73) Assignee: KONINKLIJKE PHILIPS ELECTRONICS N.V., Eindhoven (NL)

( * ) Notice: Subject to any disclaimer, the term of this patent is extended or adjusted under 35 U.S.C. 154(b) by 1046 days.

(21) Appl. No.: 13/993,689

(22) PCT Filed: Dec. 5, 2011

(86) PCT No.: PCT/IB2011/055450
§ 371 (c)(1),
(2), (4) Date: Jun. 13, 2013

(87) PCT Pub. No.: WO2012/080898
PCT Pub. Date: Jun. 21, 2012

(65) Prior Publication Data
US 2013/0278262 A1   Oct. 24, 2013

Related U.S. Application Data
(60) Provisional application No. 61/423,624, filed on Dec. 16, 2010.

(51) Int. Cl.
*G01R 33/3873* (2006.01)
*G01R 33/24* (2006.01)
(Continued)

(52) U.S. Cl.
CPC ......... *G01R 33/3873* (2013.01); *G01R 33/34* (2013.01); *G01R 33/543* (2013.01);
(Continued)

(58) Field of Classification Search
CPC .. G01R 33/3873; G01R 33/34; G01R 33/543; G01R 33/5659; G01R 33/246; G01R 33/34076
See application file for complete search history.

(56) References Cited

U.S. PATENT DOCUMENTS 4,623,844 A   11/1986  Macovski
5,017,872 A    5/1991  Foo et al.
(Continued)

FOREIGN PATENT DOCUMENTS

JP    04288139 A   10/1992
JP    08191809 A    7/1996

OTHER PUBLICATIONS

Stefan, Anca Irina, "Modeling and Design of Resonators for Electron Paramagnetic Resonance Imaging and Ultra High Field Magnetic Resonance Imaging", The Ohio State University 2005.
(Continued)

*Primary Examiner* — Gregory H Curran (57) ABSTRACT

Coil elements (18) generate a $B_1$ excitation field in an examination region (14), which $B_1$ excitation field is distorted by patient loading (e.g., wavelength effects). Passive shimming elements (22, 24) are disposed between the coil elements and the subject in order to improve the $B_1$ field uniformity. In one embodiment, passive shimming elements include one or more dielectric rods (55) disposed below the subject which generate no substantial MR proton signal and which have a permittivity of at least 100 and preferably greater than 500. In another embodiment, tubes (24) adjacent each coil element are supplied with a dielectric liquid, a thickness of the dielectric liquid between the coil element and the subject adjusting a phase of the $B_1$ field generated by the coil element. Active $B_1$ shimming may be combined with passive shimming elements (22, 24) to effect an improved RF field homogeneity result.

15 Claims, 8 Drawing Sheets (51) Int. Cl.
*G01R 33/565* (2006.01)
*G01R 33/54* (2006.01)
*G01R 33/34* (2006.01)

(52) U.S. Cl.
CPC ........ *G01R 33/5659* (2013.01); *G01R 33/246* (2013.01); *G01R 33/34076* (2013.01)

(56) References Cited

U.S. PATENT DOCUMENTS

| | | | |
|---|---|---|---|
| 5,339,033 | A | 8/1994 | Eilenberg et al. |
| 5,343,183 | A | 8/1994 | Shimada et al. |
| 5,865,177 | A | 2/1999 | Segawa |
| 7,714,578 | B2 | 5/2010 | Weiss |
| 2005/0110493 | A1 | 5/2005 | Feiweier et al. |
| 2005/0231203 | A1 | 10/2005 | Feiweier et al. |
| 2006/0208731 | A1 | 9/2006 | Wang et al. |
| 2006/0208732 | A1 | 9/2006 | Shen et al. |
| 2007/0247160 | A1 | 10/2007 | Vaughan, Jr. |
| 2007/0262775 | A1* | 11/2007 | Lee .................. G01R 33/3415 324/309 |
| 2007/0269383 | A1 | 11/2007 | Candidus et al. |
| 2008/0180102 | A1 | 7/2008 | Lazar et al. |
| 2008/0224702 | A1 | 9/2008 | Candidus et al. |
| 2008/0265889 | A1 | 10/2008 | Zhai et al. |

OTHER PUBLICATIONS

Yang, et al. "Manipulation of Image Intensity Distribution at 7.0 T:Passive RF Shimming and Focusing With Dielectric Materials", J. Mag. Res. Imaging v. 24, n. 1; pp. 197-202 Jul. 2006.

Stefan, "Modeling and Design of Resonators for Electron Paramagnetic Resonance Imaging and Ultra High Field Magnetic Resonance Imaging", Internet, PhD Thesis from the Ohio State University, 2005.

Haines, K., et al.; New high dielectric constant materials for tailoring the B1+ distribution at high magnetic fields; 2010; Journal of Magnetic Resonance; 203:323-327.

Neufeld, A., et al.; Dielectric inserts for sensitivity and RF magnetic field enhancement in NMR volume coils; 2009; Journal of Magnetic Resonance; 200:49-55.

* cited by examiner

FIG. 4d $V_1/V_2 = 9dB, \theta = 40°$
$|B_1^+|$ deviation = 0.16 (-52%)

$|B_1^+|_{max}/|B_1^+|_{min} = 2.2$

FIG. 5a          FIG. 5b $V_1/V_2 = 8dB, \theta = 60°$   $|B_1^+|$
deviation = 0.16 (-52%)

$|B_1^+|_{max}/|B_1^+|_{min} = 2.4$

PASSIVE $B_1$ FIELD SHIMMING

CROSS REFERENCE TO RELATED APPLICATIONS

This application is a national filing of PCT application Ser. No. PCT/IB2011/055450, filed Dec. 5, 2011, published as WO 2012/080898 A1 on Jun. 21, 2012, which claims the benefit of U.S. provisional application Ser. No. 61/423,624 filed Dec. 16, 2010, which is incorporated herein by reference.

The present application relates to the magnetic resonance arts. It finds particular application in relation to radiofrequency (RF) coils and magnetic field correction generated therefrom. However, it also finds application in magnetic resonance imaging, spectroscopy and other nuclear magnetic resonance techniques.

Loading from a patient to be examined distorts the $B_1$ excitation field. The distortion varies with the size and shape of the subject, and the operational radio frequency. This distortion becomes particularly acute above 3 Tesla, which has an operational radio frequency for hydrogen of approximately 128 MHz. The lack of $B_1$ uniformity causes artifacts in the resultant images or other magnetic resonance results.

The present application provides a new and improved system and method which overcomes the above-referenced problems and others.

In accordance with one aspect, a magnetic resonance system is provided. Radio frequency coil elements are disposed adjacent an examination region to generate a $B_1$ excitation field in the examination region. At least one shimming device is disposed in the examination region between the RF coil elements and a subject to improve the uniformity in the generated $B_1$ excitation field. The passive shimming device has a prearranged position, dimension, and dielectric permittivity. It is noted that, in this context, the examination region includes the entire space within the RF coil. In some cases, such as a whole body RF coil the examination region, in this context, is larger than the usual imaging volume.

In accordance with another aspect, a method for passively shimming a $B_1$ excitation field is provided. At least one passive shimming device is disposed in an examination region defined inside of the coil elements of an RF coil. The passive shimming elements improve uniformity in the $B_1$ excitation field. The at least one passive shimming element has a prearranged position, dimension, and dielectric permittivity.

One advantage is that $B_1$ excitation uniformity is improved.

Another advantage is that work flow for MR imaging at high fields strengths is improved.

Another advantage is that signal-to-noise ratio is improved.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
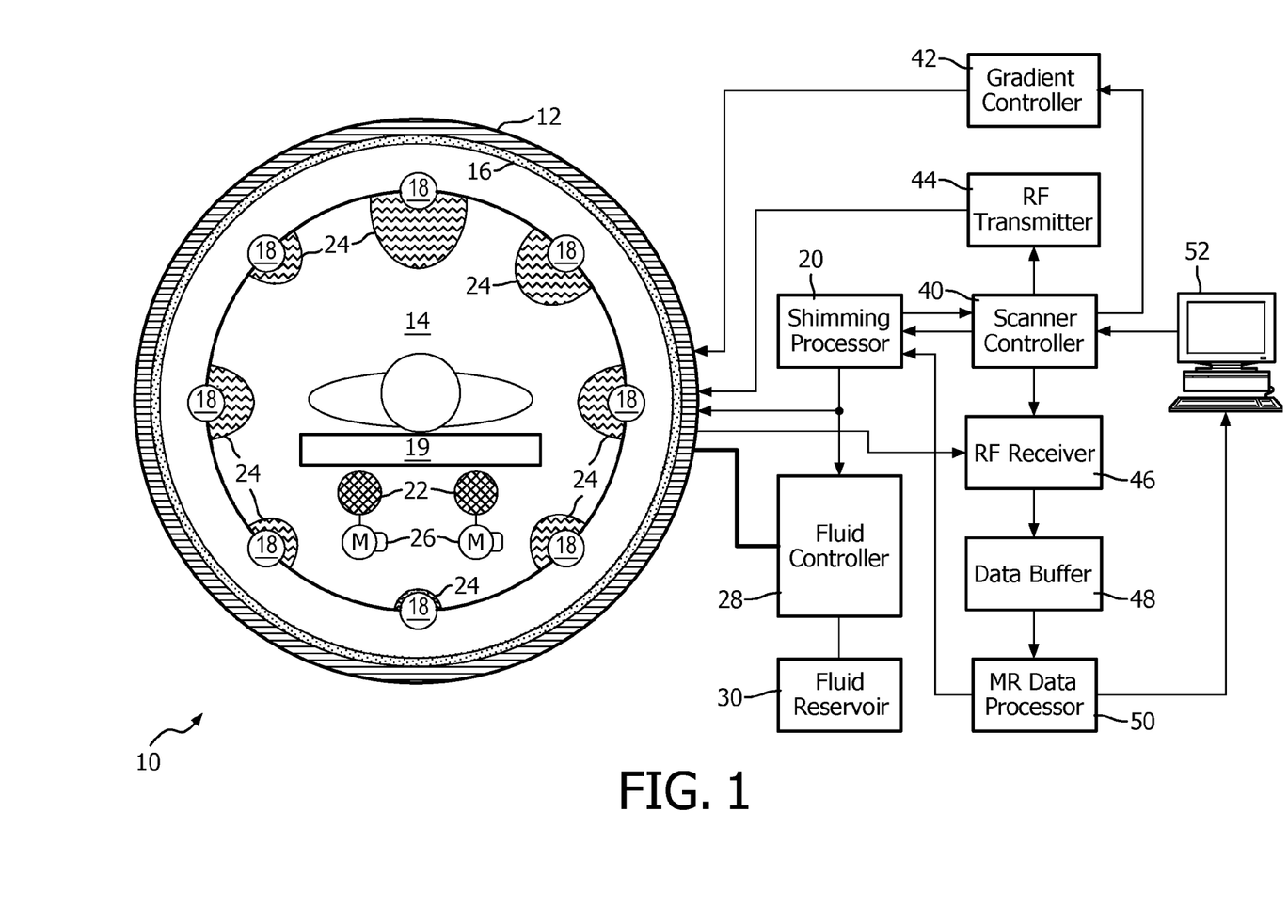
FIG. 1 is a diagrammatic illustration of a magnetic resonance system which includes passive shimming devices.
Figure 2:
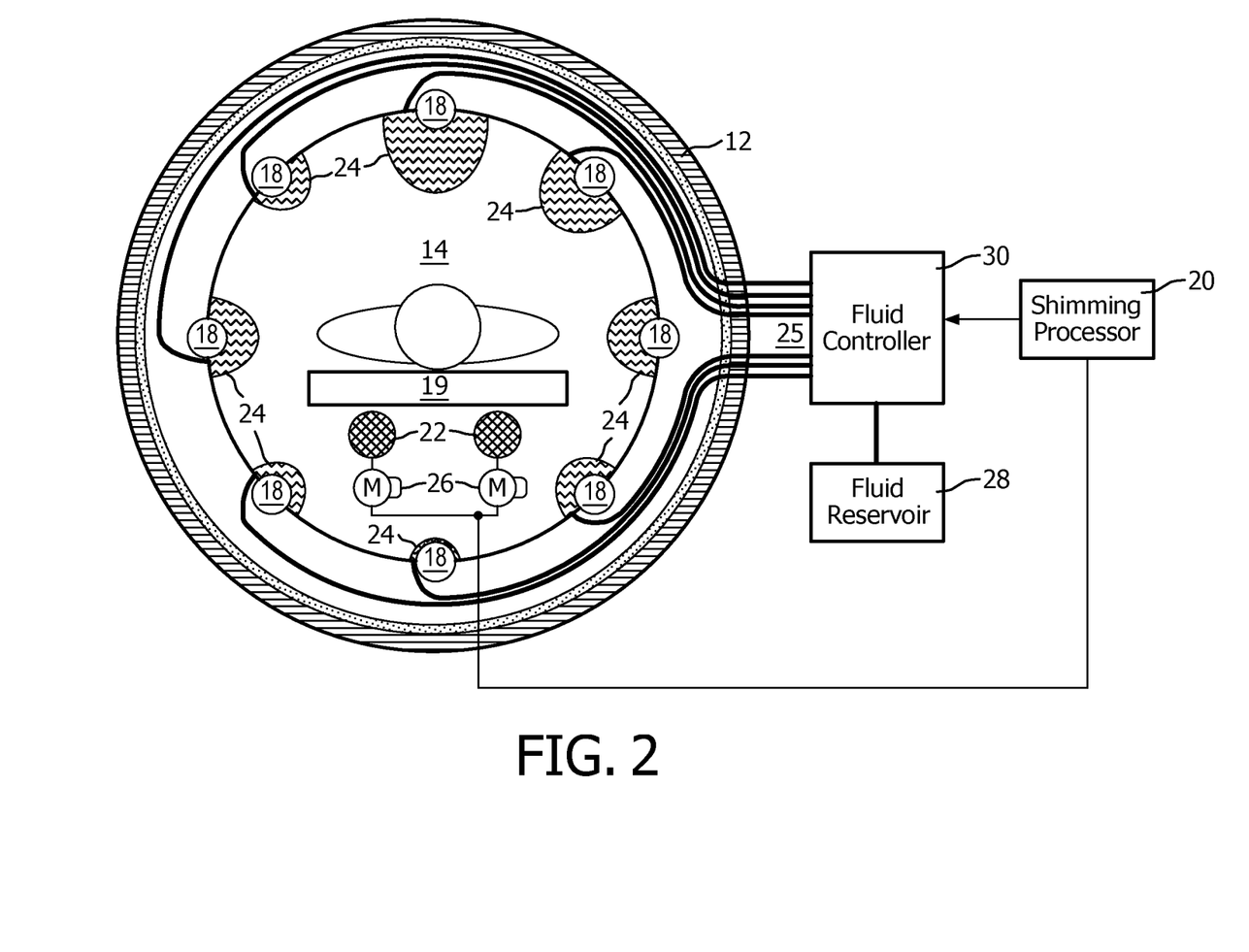
FIG. 2 is another diagrammatic illustration of the magnetic resonance system and passive shimming devices.

With reference to FIGS. 1 and 2, a magnetic resonance (MR) imaging system 10 includes a main magnet 12 which generates a spatial and temporally uniform $B_0$ field of at least 3 Tesla and above through an examination region 14. The main magnet can be an annular or bore-type magnet, or the like. Gradient magnetic field coils 16 disposed adjacent the main magnet serve to generate magnetic field gradients along selected axes relative to the $B_0$ magnetic field for spatially encoding magnetic resonance signals, for producing magnetization-spoiling field gradients, or the like. The magnetic field gradient coil 16 may include coil segments configured to produce magnetic field gradients in three orthogonal directions, typically longitudinal or z, transverse or x, and vertical or y directions.

A radio-frequency (RF) coil assembly, such as a whole-body radio frequency coil, is disposed adjacent the examination region. The RF coil assembly may include a plurality of individual RF coil elements 18, or may be a birdcage-type coil with the multiple elements 18 interconnected by end ring RF coil structures. In the illustrated embodiment, eight coil elements 18 are shown. However, more or less coil elements 18 are also contemplated. The RF coil assembly generates radio frequency pulses for exciting magnetic resonance in aligned dipoles of the subject. In some embodiments, the radio frequency coil assembly 18 also serves to detect magnetic resonance signals emanating from the imaging region. In other embodiments, local or surface RF coils (not shown) are provided in addition to or instead of the whole-body RF coil for more sensitive, localized spatial encoding, excitation, and reception of magnetic resonance signals. The individual RF coils 18 together can act a single coil, as a plurality of independent coil elements, as an array such as in a parallel transmit system, or a combination. For example, where the RF coil 18 is configured as a birdcage-type coil the two modes may be driven independently for purposes of RF shimming.

To improve homogeneity of the $B_1$ field, or excitation field, in the examination region 14, a uniformity distribution $|B_1^+|$ of the transmit coils 18 is determined by a shimming processor 20, e.g. by a short measurement prior to the actual imaging sequence to compensate for dielectric resonances occurring in patient tissue at high frequencies, i.e. Larmor frequency at static fields strengths, particularly at 3 Tesla or greater. The imaging system 10 includes one or more passive shimming devices 22, 24 disposed in the examination region 14 to improve the homogeneity of the excitation field.

In one embodiment, the passive shimming devices are dielectric rods 22 composed of a solid dielectric material having a dielectric permittivity ($\in_r$) of at least 100. Several dielectric rods 22 with varying length, shape, and dielectric permittivity are available to optimize the homogeneity of the $B_1$ excitation field. Shapes include cylindrical, elliptical, rectangular, or the like. The shimming processor 20 determines the number, length, and position of the dielectric rods to be disposed in the examination region based on the determined uniformity distribution which optimizes homogeneity of the $B_1$ excitation field. In order not to disrupt the workflow of an imaging procedure, the rods 22 are disposed on a lower side of the subject as stand-alone structures in the examination region 14 or as part of the patient support 19. The rods can be manually positioned in the examination region 14 by a clinician or automatically by an actuator 26, such as non-ferromagnetic motor or the like. The actuator receives the determined position of the rods 22 from the shimming processor 20 and adjusts the x, y, and z position and rotation accordingly. The actuator 26 can remove one or more of the rods 22 or introduce additional rods into the examination region 14 without user intervention.

In another embodiment, the shape, size, placement, and dielectric permittivity of the rods are determined for a nominal patient and the rods are fixedly mounted. In another embodiment, the shape, size, placement, and dielectric permittivity are calculated for a plurality of groups or classes of patients, such as large or obese, normal or average, and petite.

In another embodiment, the passive shimming devices include tubes 24 of dielectric fluid, each being disposed adjacent to a corresponding coil element 18 in-between the examination region 14 and the individual coil 18. Examples of dielectric fluids include heavily doped water, heavy water, or other non-proton MR signal generating fluid. The volume of dielectric fluid in each tube 24 is adjusted by a fluid controller 28 according to the uniformity distribution to optimize the homogeneity of the $B_1$ excitation field. A fluid reservoir 30 supplies the dielectric fluid to the fluid controller 28 which supplies the fluid to each tube 24 via supply lines 25 routed through a gantry housing of the imaging system 10. The reservoir 30 may include a plurality of sub-reservoirs, each of which includes dielectric fluid with a unique dielectric permittivity. In this arrangement, the fluid controller 28 can supply dielectric fluid from one or more of the sub-reservoirs to each tube 24. Therefore, the dielectric permittivity of each tube can be tuned by adjusting the dielectric permittivity of the fluid and the volume of the fluid.

The tubes 24 can have the same or different lengths, in the axial direction, of the corresponding coil element 18 adjacent the tube. In one embodiment, the tubes 24 include a serpentine structure to ensure a uniform cross-section along the length of the tube or a uniform volume in the axial direction. In another embodiment, each tube is segmented in the axial direction. The fluid controller 28 can adjust the volume of each segment to account for non uniform dielectric load by the patient in the axial direction. For example, the head, torso, and legs exhibit varying dielectric loading because of the size, geometry, internal structure, and density of the corresponding anatomical region. In a further embodiment, each segment includes a serpentine structure to ensure that each segment has a uniform cross-section or volume in the axial direction. In another embodiment, the tubes 24 are or include expandable bladders or other structures to control the distribution of liquid between each coil element 18 and the imaging region 14. For one example, a uniform thickness of liquid can be formed around the side of the coil element towards the imaging region. For another example, a parabolic distribution can be provided.

In another embodiment, the imaging system 10 includes both the dielectric rods 22 and the tubes 24 of dielectric fluid to shim the $B_1$ excitation field for optimal homogeneity. After analysis of the uniformity distribution, the shimming processor 20 determines the optimal size, geometry, dielectric permittivity, and position of each dielectric rod 22 and the shimming processor 20 determines the optimal volume and dielectric permittivity of each tube 24 which affords the optimal $B_1$ excitation field for the imaging subject. For example, the size, geometry, dielectric permittivity, and position of the rods 22 can be fixed and the liquid in the tubes 24 can be used to fine tune the $B_1$ field.

Once the $B_1$ excitation field is optimized for the imaging subject, magnetic resonance data of the subject is acquired. The subject remains inside the examination region 14 in the same position as when the uniformity distribution was determined. A scan controller 40 controls a gradient controller 42 which causes the gradient coils 16 to apply the selected magnetic field gradient pulses across the imaging region, as may be appropriate to a selected magnetic resonance imaging or spectroscopy sequence. The scan controller 40 also controls at least one RF transmitter 44 which causes the RF coil assembly to generate magnetic resonance excitation and manipulation of $B_1$ pulses. In a parallel system, the RF transmitter 44 includes a plurality of transmitters or a single transmitter with a plurality of transmit channels, each transmit channel operatively connected to at least one corresponding coil element 18 of the assembly. In the case of a birdcage-type RF coil the transmitter may have two independent channels to drive the two modes of the birdcage. The scan controller, in coordination with the shimming processor, also controls the transmitter and gradient controller to generate $B_1$ shimming sequences and $B_1$ shimmed sequences.

The scan controller also controls an RF receiver 46 which is connected to the RF coils 18, and/or a dedicated receive coil placed inside the examination region 14, to receive magnetic resonance signals therefrom. In a parallel system, the RF receiver 46 includes a plurality of receivers or a single receivers with a plurality of receive channels, each receive channel operatively connected to at least one corresponding coil element 18 of the assembly. The received data from the receiver 46 is temporarily stored in a data buffer 48 and processed by a magnetic resonance data processor 50. The magnetic resonance data processor can perform various functions as are known in the art, including image reconstruction, magnetic resonance spectroscopy processing, catheter or interventional instrument localization, and the like. Reconstructed magnetic resonance images, spectroscopy readouts, interventional instrument location information, and other processed MR data are displayed on a graphical user interface 52. The graphic user interface 52 also includes a user input device which a clinician can use for controlling the scan controller 40 to select scanning sequences and protocols, and the like.

In another embodiment, the imaging system 10 is a parallel transmit system with a plurality of RF transmitters 44. The shimming processor 20 determines unique a phase and amplitude component for each excitation signal generated by the individual RF transmitters 44 based on the analyzed uniformity distribution. In this arrangement, the $B_1$ excitation field is optimized by varying the generated $B_1$ excitation field transmitted by the individual coil elements 18. For example, in a two-channel parallel transmit system the imaging system 10 includes two RF transmitters 44 where each transmitter is operatively connected to one or more feed points of the coil elements 18 or connected to drive the two modes of a birdcage-type RF coil. The shimming processor determines changes in the phase and amplitude of $B_1$ excitation signal for each channel such that the composite $B_1$ excitation field resulting from the two channels is optimized for homogeneity. The shimming processor controls the amount of fluid in each tube 24 to adjust the relative phase of RF field produced by coil segments associated with the same transmitter.

In another embodiment, the imaging system 10 includes the dielectric rods 22, the tubes 24 of dielectric fluid, and the parallel transmit system with multiple RF transmitters 44 to shim the $B_1$ excitation field for optimal homogeneity. After analysis of the uniformity distribution, the shimming processor 20 determines the optimal size, geometry, dielectric permittivity, and position of each dielectric rod 22; the optimal volume distribution, and dielectric permittivity of dielectric fluid for each tube 24; and unique phase and amplitude components for each excitation signal generated by each of the RF transmitters 44. As a result, the homogeneity of the overall $B_1$ field is substantially improved at higher field strengths for the imaging subject.

Figure 3:
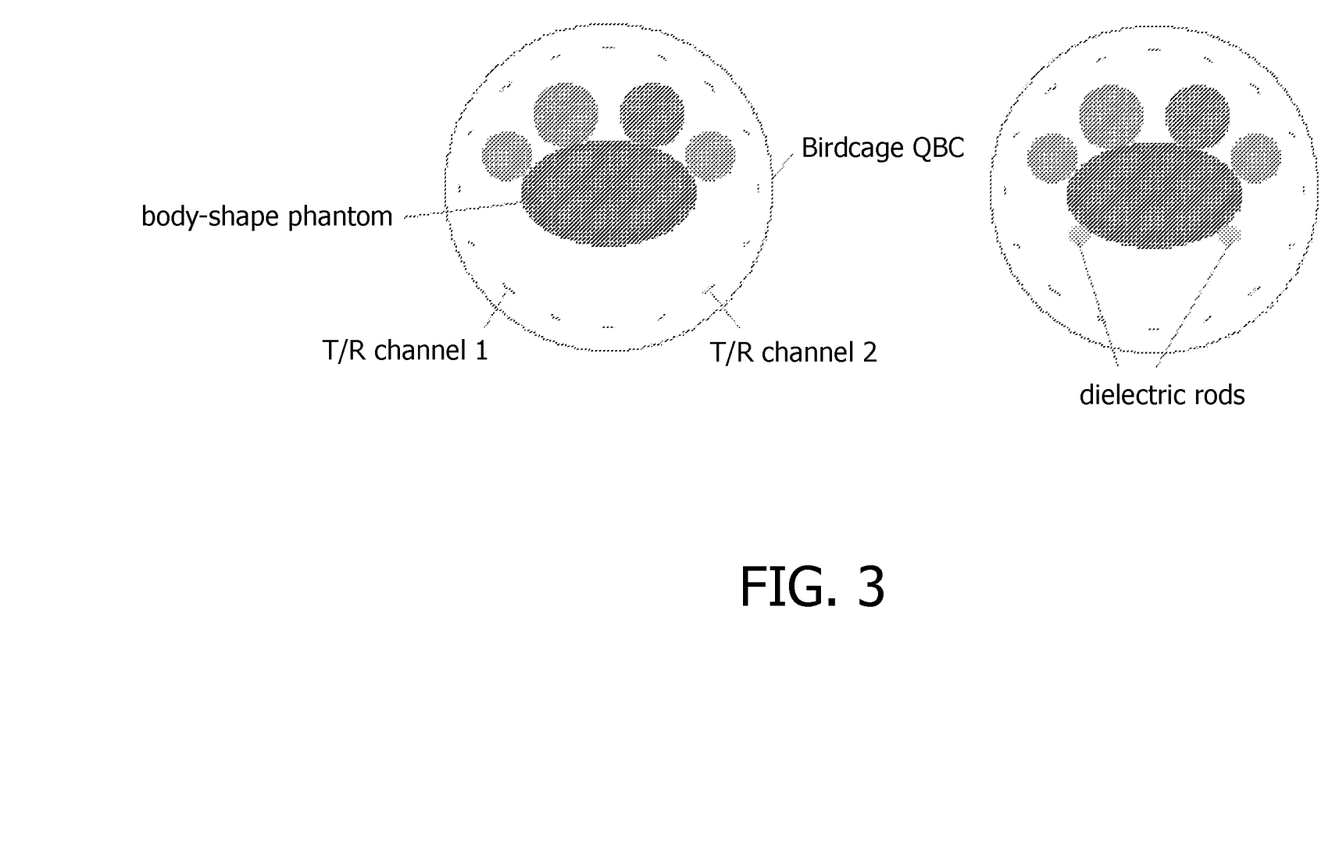
FIG. 3 illustrates a female body-shaped phantom in a quadrature birdcage body coil with and without dielectric passive shimming rods.
Figure 4A:
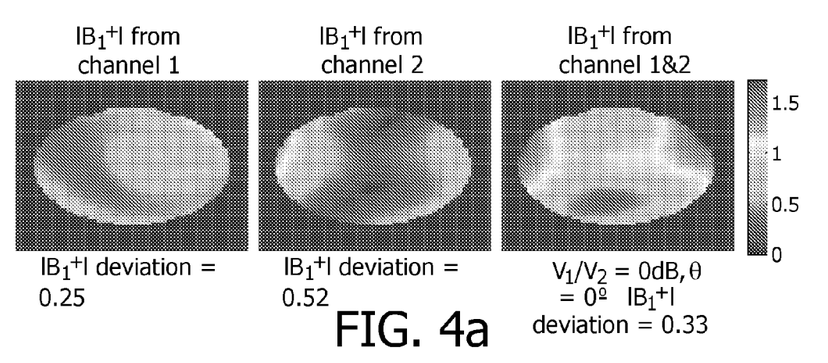
FIG. 4 illustrates $B_1$ distributions with various shimming combinations using a quadrature birdcage body coil with two independent transmit/receive channels.
Figure 4B:
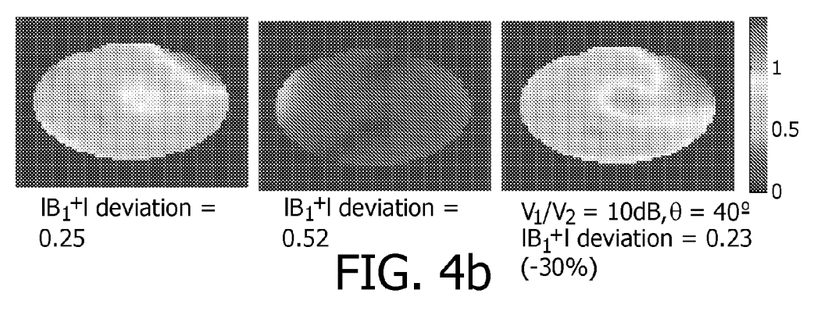
Figure 4C:
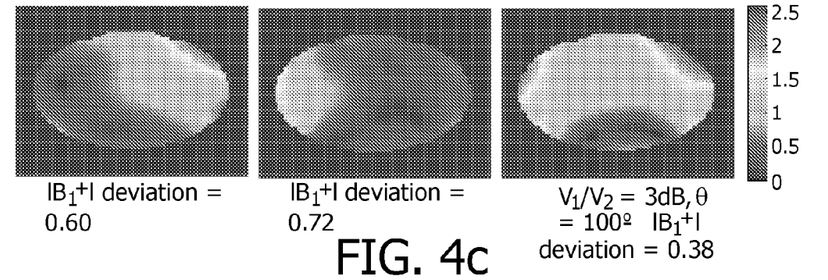
Figure 4D:
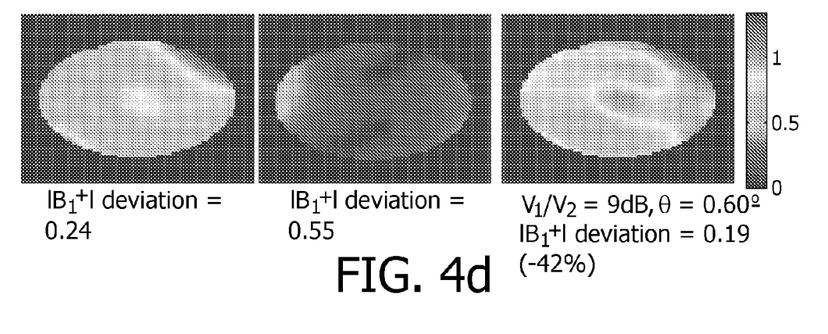

With reference to FIGS. 3 and 4, the improvement of homogeneity of the $B_1$ excitation field is illustrated in a Finite-difference time-domain (FDTD) model for a 3 Tesla imaging system 10. The RF assembly in this embodiment is a birdcage-type quadrature body coil (QBC) loaded with a female body-shaped phantom. The QBC is driven with two independent transmit/receive (T/R) channels. With reference to FIG. 4, as seen, $|B_1^+|$ over the center transverse slice of the phantom is relatively non-uniform. Considering $|B_1^+|$-shimming over the torso region only (excluding both arms and breasts), (a) shows that, in a conventional quadrature feed case, the $|B_1^+|$ standard deviation (divided by mean field, no units) in the torso area is 0.33. When using two channel transmit, $|B_1^+|$ standard deviation can be reduced to 0.23, a 30% improvement, as shown in (b). As seen in (b), the shimmed $|B_1^+|$ is still not quite uniform with higher $|B_1^+|$ over upper-right area and lower $|B_1^+|$ over bottom-left area. The ratio of maximum $|B_1^+|$ over minimum $|B_1^+|$ is 3.6 when comparing to 7 for convention quadrature feed (a).

Continuing with reference to FIG. 4, to further improve $|B_1^+|$ uniformity, two dielectric rods are inserted in the bottom left area and right area of the phantom adjacent to the phantom (as depicted in FIG. 3). The diameter of the rods is 4 cm with length of 65 cm and a dielectric constant $\in_r=1000$. The rods are separated 31 cm apart. As seen in (c), even though the cross-section of two rods is relatively small compared with that of the body phantom, $|B_1^+|$ field distribution is re-distributed over the $|B_1^+|$ shimming area. When permittivity $\in_r$ is reduced to 100, as shown in (d), a better shimmed $|B_1^+|$ is achieved with deviation of 0.19, which is 42% better than 0.33 result for the un-shimmed quadrature feed case; the result is also better than the 0.23 deviation of (b) when RF shimming only is used. The ratio of maximum $|B_1^+|$ over minimum $|B_1^+|$ is 3.3, better than the optimal 2-channel shimming case result of 3.6 in (b) without the rods.

Figure 5A:
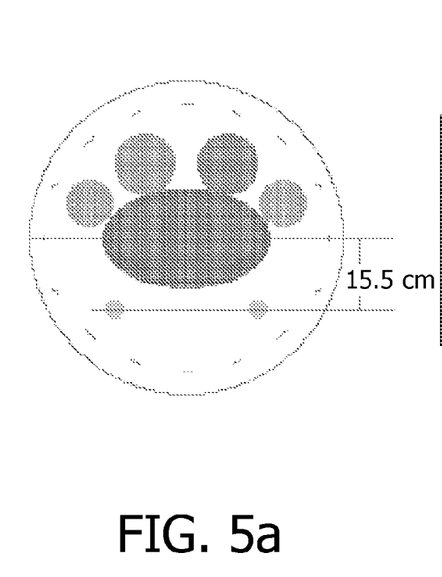
FIGS. 5A and 5B illustrate a symmetric placement of two shimming rods disposed below a phantom and the resultant $B_1$ field distribution using a quadrature birdcage body coil with two independent transmit/receive channels.
Figure 5B:
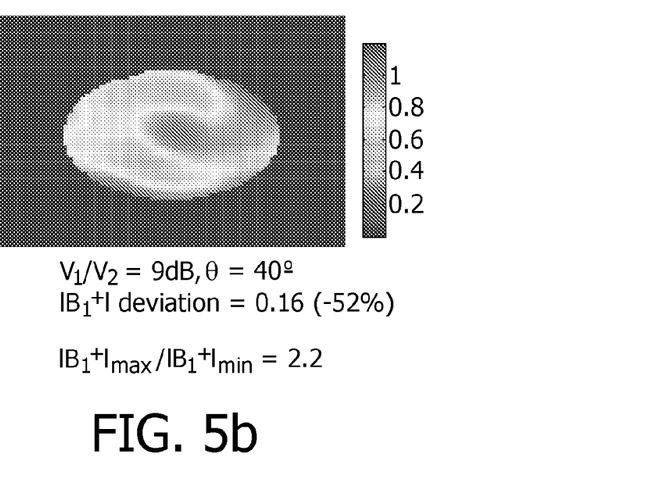

With reference to FIGS. 5A and 5B, in another scenario, two same-sized rods are placed away from the phantom which would model the rods 22 being placed inside the patient table 19. The distance from the two rods to the isocenter of the QBC is 15.5 cm, the $\in_r=1000$ for both of the rods 22 in this case, and the two rods 22 are positioned 31 cm apart. As seen from the shimmed $|B_1^+|$ in FIG. 5B, over the defined shimming area $|B_1^+|$ the standard deviation is reduced to 0.16, 52% less than the un-shimmed quadrature driven case result of 0.33 in (a) of FIG. 4 and 30% less than the shimmed quadrature driven case result of 0.23 in (b) of FIG. 4 without the dielectric rods. The ratio of maximum $|B_1^+|$ over minimum $|B_1^+|$ is 2.2 comparing with 3.6 of shimmed case without the use of dielectric rods.

Figure 5C:
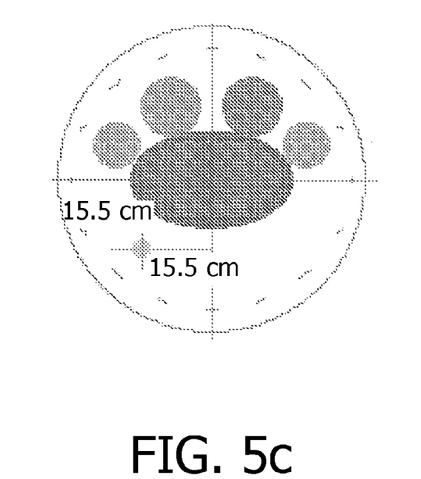
FIGS. 5C and 5D illustrate a single passive shimming rod disposed below the phantom and the corresponding $B_1$ distribution using a quadrature birdcage body coil with two independent transmit/receive channels.
Figure 5D:
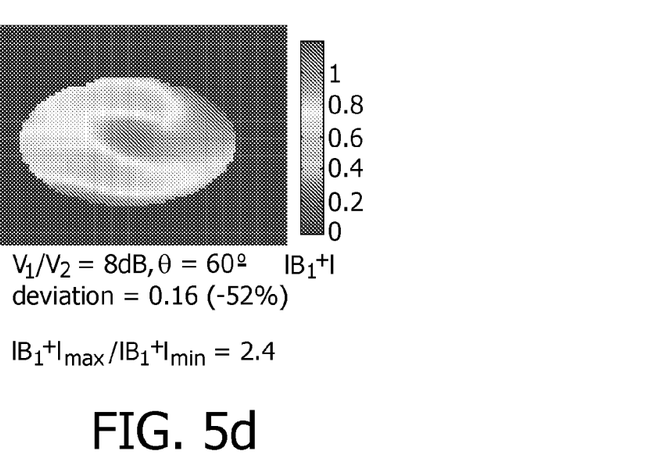

With reference to FIGS. 5C and 5D, when local receive coils are used, one dielectric rod can be used to improve only the transmit $|B_1^+|$-field. As shown in FIGS. 5C and 5D, the shimmed $|B_1^+|$ case with dielectric rod ($\in_r=1000$) positioned to the left of the phantom, the $|B_1^+|$ distribution is almost identical to that of two rods case in FIGS. 5A and 5B. From the model, the left dielectric rod (FIG. 5C) has a greater $|B_1^+|$ shimming influence than the right dielectric rod during RF field transmission. On the other hand, the right dielectric rod has much more effect on the $|B_1^-|$ shimming during reception of the MR signal.

Figure 6:
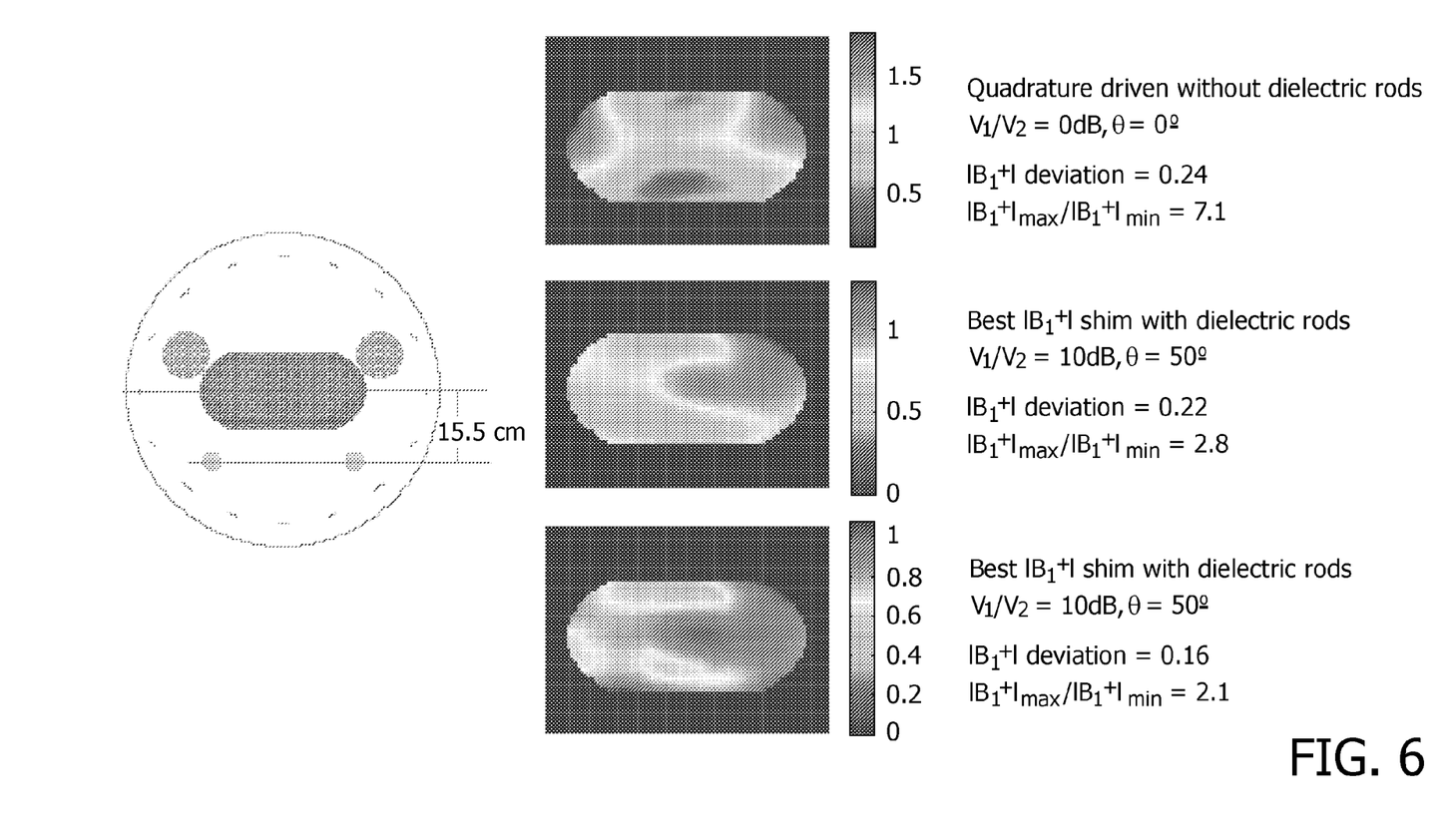
FIG. 6 illustrates a symmetric placement of passive shimming rods below a slim body-shaped phantom and resultant $B_1$ field distributions with quadrature driven RF coils and no dielectric rods, with $B_1$ shimming without dielectric rods, and shimming with the dielectric rods.

In above calculations using the FDTD model, we used a "body-shaped" female phantom body model with the aspect ratio of 0.60 (anterior-posterior width over left-right width in the torso center transverse slice). The same calculations are also repeated for a "body-shaped" male phantom body model with a slimmer aspect ratio of 0.46 (modified from the female model by removing the breast and reducing the aspect ratio). FIG. 6 shows the $|B_1^+|$-field over the center transverse slice excluding arms (shimming area). As seen, with the addition of dielectric rods ($\in_r=1000$), $|B_1^+|$ uniformity is also improved further from the shimming case without the dielectric rods.

To further optimize $|B_1^+|$ uniformity using one or more dielectric rod(s) 22, the rod diameter, size, the optimal permittivity $\in_r$, and positions can be determined through the FDTD modeling or other numerical calculations with the shimming processor 20. The dielectric rods can either be mobile, e.g., used inside the patient accessible area of the bore, or be placed in permanent positions under the patient table (i.e., non-patient accessible area of the bore). The dielectric rods can be made of materials without proton MR signals (heavily doped water to mitigate proton signal, or ceramics without substantial electrical conductivity). They are relatively small and can be inserted into the QBC space.

Figure 7:
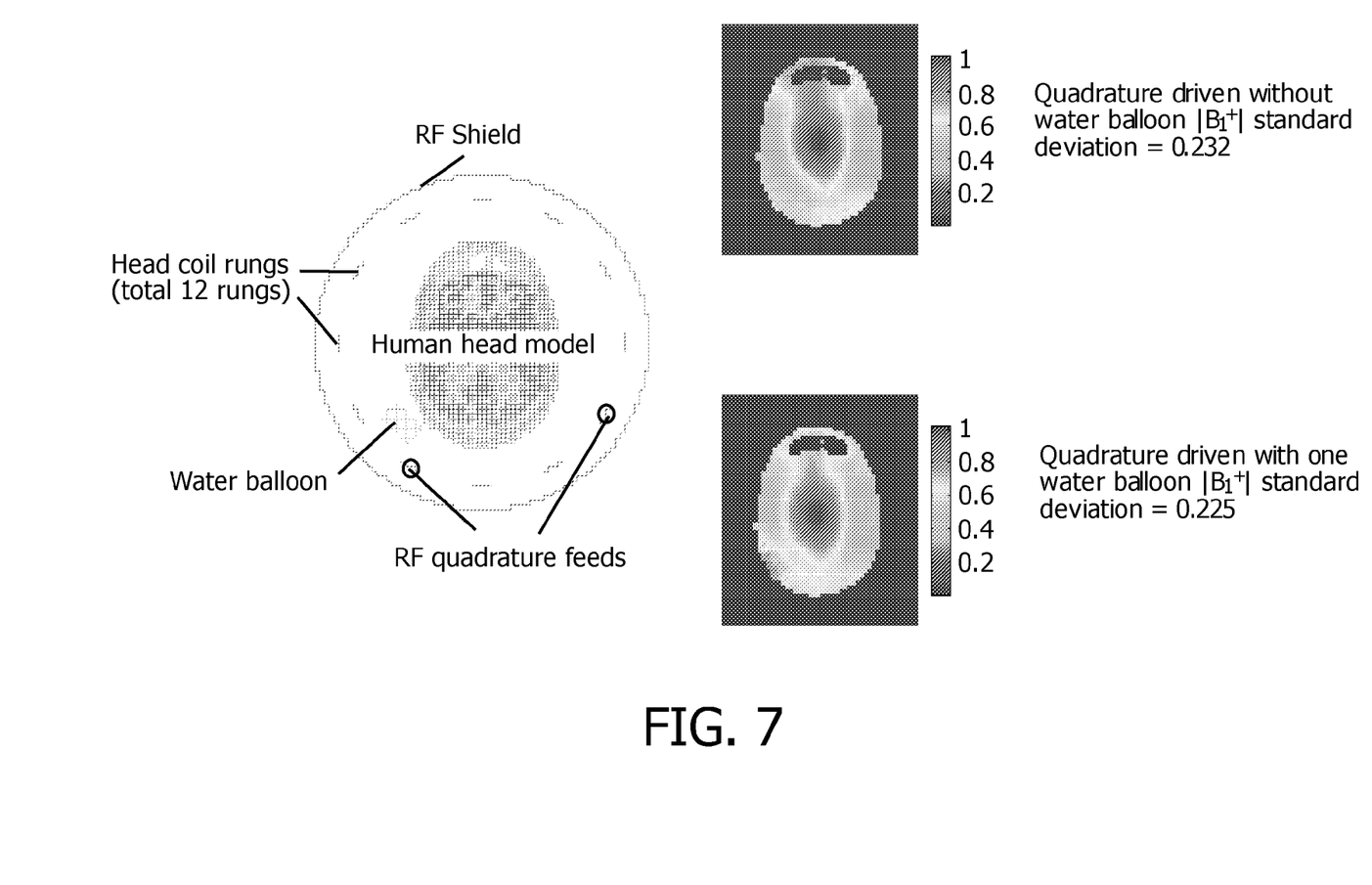
FIG. 7 illustrates an RF head coil with a human head model in which the passive shimming element includes a water balloon and the resultant $B_1$ distribution with and without the water balloon.

With reference to FIG. 7, a 7 Tesla head T/R coil model was driven in quadrature using a single transmit channel with a quadrature T/R switch. One rectangular water balloon with dimension of 4 cm×2.5 cm×16.5 cm is placed between two coil rungs and a human head model. Calculated $|B_1^+|$-field in the center transverse slice is also shown ($|B_1^+|$ is normalized to the field at the center). As shown, the $|B_1^+|$ standard deviation (divided by mean value, no units) for the conventional quadrature driven case is 0.232. With the addition of one water balloon, it reduced to 0.225, a 3% reduction of $|B_1^+|$ field non-uniformity. In other cases, when more than one water balloons are used, the sizes and positions of these water balloons can be optimized. The conductivity (salt level) can also be optimized for individual water balloons, we expect even more improvement of $|B_1^+|$ uniformity.

Figure 8:
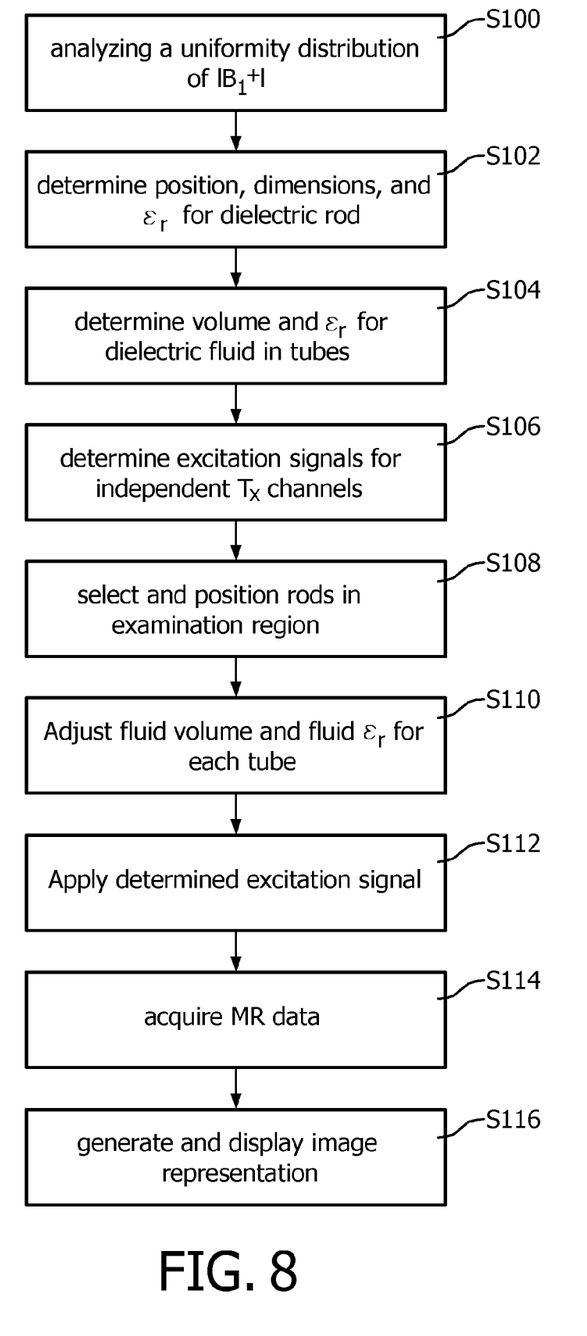
FIG. 8 illustrates a method of using the passive shimming elements.

With reference to FIG. 8, a method for shimming a $B_1$ excitation field is presented. After a subject is positioned in the examination region, a $B_1$ field is generated and its uniformity is analyzed S100 by the shimming processor 20. Based on the analyzed uniformity distribution $|B_1^+|$, the shimming processor 20 determines the position, dimensions, and dielectric permittivity ∈_r S102 of the dielectric rods 22 to be disposed in the examination region 14 and/or the volume and ∈_r S104 of the dielectric fluid supplied to each tube 24; and the excitation signal S106 for each independent transmit channel $T_x$. The actuator 26 selects and positions the dielectric rods 22 accordingly S108. The fluid controller 28 adjusts the volume and ∈_r of the dielectric fluid accordingly S110. Optionally, steps S100-S110 can be iteratively repeated to optimize the $B_1$ uniformity. Once the passive shimming devices 22, 24 are tuned according to the analyzed uniform distribution, the RF transmitter 44 causes the coils elements 18 associated with each transmit channel to apply a shimmed $B_1$ excitation field S112 to the examination region 14 according to the excitation signals determined in step S106. The induced MR signals are received S114 by the RF receiver 48 via the coil elements 18 or a dedicated receive coil in examination region 14 and reconstructed S116 into an image representation of the subject by the data processor 50. The image representation is displayed on the graphical user interface 52.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

Having thus described the preferred embodiments, the invention is now claimed to be:

1. A magnetic resonance system, comprising:
   radiofrequency (RF) coil elements disposed adjacent to an examination region and configured to generate a $B_1$ excitation field in the examination region according to a generated excitation signal; and
   a plurality of solid dielectric rods disposed in the examination region between the at least one RF coil and a subject disposed in the examination region which improve uniformity in the generated $B_1$ excitation field, the rods having prearranged dimensions and dielectric permittivity;
   at least one actuator configured to position the dielectric rods in the examination region between the RF coil elements and the subject and/or replace one or more of the dielectric rods with one or more dielectric rods with different dimensions and/or different permittivity;
   a shimming processor configured to analyze a $B_1$ field distribution of the generated excitation field with the subject disposed in the examination region and determine at least one of position, dimensions, and dielectric permittivity for the at least one dielectric rods and control the at least one actuator to reposition and/or replace at least one of the dielectric rods to improve a uniformity of the $B_1$ field distribution to optimize a $B_1$ field homogeneity of the excitation field in the examination region.

2. The magnetic resonance system according to claim 1, wherein the at least one dielectric rods are disposed on a lower side of the subject.

3. The magnetic resonance system according to claim 1, wherein the dielectric permittivity of the dielectric rods is at least 100, preferably greater than 500.

4. The magnetic resonance system according to claim 1, further including:
   a tube or reservoir with a variable volume of dielectric fluid disposed adjacent to each of the RF coil elements and wherein the shimming processor is further configured to control a volume of dielectric fluid in the tube or reservoir.

5. The magnetic resonance system according to claim 1, further including:
   two or more RF transmitters, each which generates an excitation signal for transmission via the RF coil elements to generate a passively shimmed excitation field.

6. The magnetic resonance system according to claim 5, wherein the RF coil elements form a birdcage-type RF coil and the two or more RF transmitters each generate an excitation signal for transmission via the birdcage-type RF coil to generate a passively and actively shimmed excitation field.

7. The magnetic resonance system according to claim 5, wherein the shimming processor controls each of the RF transmitters to generate a unique excitation signal according to the analyzed uniformity distribution to improve homogeneity of the passively shimmed excitation field.

8. The magnetic resonance system according to claim 1, further including:
   a main magnet which generates a static magnetic field of at least 3 Tesla in the examination region; and
   at least one RF receiver which receive induced MR signals from examination region resulting from the excitation signal.

9. A magnetic resonance system comprising:
   radiofrequency (RF) coil elements adjacent to an examination region configured to generate a $B_1$ excitation field in the examination region according to a generated excitation signal;
   one or more tubes configured to hold a dielectric fluid disposed in the examination region between the at least one RF coil and a subject;
   a reservoir configured to supply the dielectric fluid to the at least one tube; and
   a fluid controller configured to control at least one of a volume of dielectric fluid in the at least one tube and a dielectric permittivity of the dielectric fluid supplied to the one or more tubes to improve uniformity in the generated $B_1$ excitation field in the examination region.

10. The magnetic resonance system according to claim 9, further including:
    a shimming processor configured to analyze a $B_1$ distribution of the generated excitation field and control the fluid controller to optimize $B_1$ homogeneity of the examination field.

11. The magnetic resonance system according to claim 9, further including:
    a main magnet configured to generate a static magnetic field of at least 3 Tesla in the examination region; and
    at least one RF receiver configured to receive induced MR signals from the examination region resulting from the excitation signal.

12. A method for passively shimming a $B_1$ excitation field comprising:
    disposing at least one passive shimming device in an examination region defined inside coil elements of an RF coil to improve uniformity in the $B_1$ excitation field generated by the RF coil, the at least one passive shimming device including at least one of:
    tubes with a volume of dielectric fluid disposed adjacent to the coil elements of the at least one RF coil, and
    at least one rod composed of a solid dielectric material without a substantial MR proton signal and with a permittivity greater than 100;

with a controller, controlling at least one of the volume of dielectric fluid in each tube and a position of the at least one rod.

13. The method according to claim 12, further including:

analyzing a $B_1$ distribution of the generated excitation field; and determining at least one of a position, dimensions, and dielectric permittivity for the at least one passive shimming device which improves a $B_1$ uniformity of the generated excitation field.

14. The method according to claim 12, further including:

selecting one of a plurality of rods of different sizes and/or permittivity in accordance with a size of a subject to be examined; and positioning the selected rod in the examination region.

15. A magnetic resonance system, comprising:

an examination region for receiving a subject to be examined;

a plurality of radiofrequency (RF) coil elements adjacent to the examination region which generate an excitation field in the examination region according to a generated excitation signal;

two or more RF transmitters, each which generates the excitation signal for transmission via at least one of the plurality of RF coils to generate a $B_1$ excitation field;

a passive shimming device including at least one of:

a rod composed of a solid dielectric material without a proton signal and with a permittivity greater than 100 disposed in the examination region below the subject to passively shim the generated $B_1$ excitation field and an actuator for repositioning or replacing the rod;

a plurality of tubes configured to receive a variable volume of dielectric fluid disposed adjacent to the plurality of RF coil elements to passively shim the generated $B_1$ excitation field and a controller for controlling the volume of dielectric fluid in the tubes; and a shimming processor which analyzes uniformity of the $B_1$ excitation field in the examination region and therefrom determines at least one of (a) at least one of a position, dimensions, and/or dielectric permittivity of the rod, (b) the volume of dielectric fluid in each tube and/or the dielectric permittivity of the dielectric fluid supplied to each tube, (c) amplitude and/or phase settings for the two or more RF transmitters, the shimming processor being connected with at least one of the actuator and the controller to control repositioning or replacing the rod and/or controlling the volume of dielectric fluid in the tubes based on the uniformity analysis.

* * * * *